US012335037B2

(12) United States Patent
Li

(10) Patent No.: US 12,335,037 B2
(45) Date of Patent: Jun. 17, 2025

(54) DIGITAL RADIO RECEIVERS

(71) Applicant: Nordic Semiconductor ASA, Trondheim (NO)

(72) Inventor: Wei Li, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 232 days.

(21) Appl. No.: 18/024,468

(22) PCT Filed: Sep. 6, 2021

(86) PCT No.: PCT/EP2021/074517

§ 371 (c)(1),
(2) Date: Mar. 2, 2023

(87) PCT Pub. No.: WO2022/049292

PCT Pub. Date: Mar. 10, 2022

(65) Prior Publication Data

US 2023/0327807 A1 Oct. 12, 2023

(30) Foreign Application Priority Data

Sep. 4, 2020 (GB) ..................................... 2013945

(51) Int. Cl.

*H04L 1/00* (2006.01)
*H03M 13/41* (2006.01)
*H04L 27/144* (2006.01)

(52) U.S. Cl.

CPC .......... *H04L 1/0072* (2013.01); *H03M 13/41* (2013.01); *H04L 1/0045* (2013.01); *H04L 27/144* (2013.01)

(58) Field of Classification Search

CPC ... H04L 1/0072; H04L 1/0045; H04L 27/144; H04L 7/042; H04L 7/046; H04L 27/156;

(Continued)

(56) References Cited

U.S. PATENT DOCUMENTS 6,311,976 B1 12/2001 Sriram
6,618,552 B1 * 9/2003 Sonu ................ G11B 20/10009 714/799

(Continued)

FOREIGN PATENT DOCUMENTS

EP 3 185 500 A1 6/2017
GB 2 545 489 A 6/2017

(Continued)

OTHER PUBLICATIONS

International Search Report and Written Opinion for PCT/EP2021/074517, mailed Dec. 21, 2021, 17 pages.

(Continued)

*Primary Examiner* — Albert Decady
*Assistant Examiner* — Enam Ahmed
(74) *Attorney, Agent, or Firm* — Klarquist Sparkman, LLP

(57) ABSTRACT

A method of operating a digital radio receiver is provided as follows: a) receiving a radio signal comprising a symbol sequence; b) selecting a portion of the symbol sequence; c) determining a first error between the selected portion of the symbol sequence and a first predetermined symbol sequence using a difference metric; d) determining a set of second errors between the selected portion of the symbol sequence and a respective set of second predetermined symbol sequences, each formed by prepending different length portions of a predetermined preamble symbol sequence to a beginning of the first predetermined symbol sequence; and e) determining a minimum error from the first error and the set of second errors. If the first error is not the minimum error, a different portion of the symbol sequence is selected. Otherwise, a following portion of the symbol sequence is decoded to produce a data payload.

18 Claims, 5 Drawing Sheets

(58) Field of Classification Search
CPC ... H04L 27/2656; H03M 13/41; H03M 13/23; H03M 13/333; H04W 4/80
USPC .......................................................... 714/819
See application file for complete search history.

(56) References Cited

U.S. PATENT DOCUMENTS

| | | | | |
|---|---|---|---|---|
| 7,830,917 | B2 * | 11/2010 | Sato ...................... | H04L 1/1607 714/53 |
| 2003/0135816 | A1 * | 7/2003 | Kim ....................... | H04B 17/20 714/819 |
| 2013/0195229 | A1 | 8/2013 | Cheng et al. | |
| 2014/0136915 | A1 * | 5/2014 | Hyde .................. | G06F 11/0703 714/747 |
| 2015/0169394 | A1 * | 6/2015 | Parthasarathy ...... | H03K 3/0375 714/819 |
| 2017/0195152 | A1 | 7/2017 | Chu et al. | |
| 2018/0159679 | A1 | 6/2018 | de Ruijter et al. | |
| 2019/0166573 | A1 | 5/2019 | Moon et al. | |
| 2019/0273577 | A1 | 9/2019 | Kang et al. | |

FOREIGN PATENT DOCUMENTS

| | | | |
|---|---|---|---|
| GB | 2 565 280 | A | 2/2019 |
| WO | WO 2019/132922 | A1 | 7/2019 |

OTHER PUBLICATIONS

IPO Search Report under Section 17(5) for Great Britain Application No. 2013945.7, mailed Dec. 9, 2020, 4 pages.

IPO Search Report under Section 17(6) for Great Britain Application No. 2013945.7, mailed Nov. 12, 2021, 2 pages.

* cited by examiner

DIGITAL RADIO RECEIVERS

CROSS REFERENCE TO RELATED APPLICATIONS

This is the U.S. National Stage of International Application No. PCT/EP2021/074517, filed Sep. 6, 2021, which was published in English under PCT Article 21 (2), which in turn claims the benefit of Great Britain Application No. 2013945.7, filed Sep. 4, 2020.

The present invention relates to digital radio receivers and methods of operating digital radio receivers.

In packet-based radio communications, data is transmitted in distinct blocks or packets that typically comprise a header section and a payload section. The header portion normally identifies the intended destination of the packet, and the payload section contains the actual data to be transmitted.

In many packet-based radio protocols, the header portion of each packet begins with a preamble section comprising a sequence of symbols (e.g. 1s or 0s) that is known to a receiver and is designed to allow the receiver to synchronise to the transmitter (i.e. to determine and correct for frequency or timing offsets). The preamble often consists of a simple repeating pattern of symbols (e.g. '01010101').

After the preamble, a data packet typically includes an address section (e.g. identifying a particular device for which the packet is intended). For example, the physical layer of the Bluetooth® standard uses packets which comprise a preamble section followed by an access address section, which identifies the particular Bluetooth connection to which the incoming signal relates. Once a receiver has synchronised to the incoming signal using the preamble section, the receiver compares the address section to an expected bit sequence corresponding to its unique address. If the address matches, the receiver goes on to retrieve the data from the payload section. The receiver may also use the address section to identify where the payload section of the packet begins (a process called frame synchronisation).

Radio communications are often affected by noise or interference such that individual bits of a received packet may not be received correctly. Therefore, some packet-based radio communication protocols utilise error correcting coding schemes, where some or all data bits of the packet are encoded in multiple symbols to add resilience to bit errors (whilst sacrificing bitrate for a given symbol or baud rate). For instance, the Bluetooth LE Coded physical layer uses a forward error correction coding scheme which uses up to 8 symbols to encode a single data bit, allowing the data to be correctly recovered even when many of the detected symbols are erroneous (e.g. due to noise). The use of a coding scheme may thus increase the effective range of a radio transmitter, as the transmitted data may still be recoverable even when the signal-to-noise ratio of the radio signal is lower than would typically be tolerable.

To recover the coded data, a receiver decodes the received sequence of symbols, e.g. using a Viterbi decoding technique. However, during frame synchronisation it may be necessary to examine a large number of candidate bit sequences before a sequence corresponding to the expected address section is found. To avoid having to decode every possible symbol sequence during frame synchronisation, it is typical simply to determine an error between the raw symbol sequence and the expected coded address section using a difference metric (e.g. a Hamming distance) and to presume that the symbol sequence corresponds to the coded address when the error is below a pre-set threshold.

However, setting this threshold too low risks reducing the noise tolerance of the radio connection (i.e. reducing its range), and setting it too high risks confusing an unrelated symbol sequence for an expected address, leading to incorrect frame synchronisation and decoding errors which can lead to greater power consumption than is necessary and potentially a delay in successfully receiving other packets which are intended for the receiver.

According to a first aspect of the present invention there is provided a method of operating a digital radio receiver comprising:

a) receiving an incoming radio signal comprising an incoming symbol sequence;
b) selecting a portion of the incoming symbol sequence;
c) determining a first error between the selected portion of the incoming symbol sequence and a first predetermined symbol sequence using a difference metric;
d) determining, using the difference metric, a set of second errors between the selected portion of the incoming symbol sequence and a respective set of second predetermined symbol sequences, each formed by prepending different length portions of a predetermined preamble symbol sequence to a beginning of the first predetermined symbol sequence; and
e) determining a minimum error from the first error and the set of second errors;

if the first error is not the minimum error, selecting a different portion of the incoming symbol sequence and repeating steps c) to e); and if the first error is the minimum error, decoding a following portion of the incoming symbol sequence to produce a data payload.

According to a second aspect of the present invention there is provided a digital radio receiver arranged to:

a) receive an incoming radio signal comprising an incoming symbol sequence;
b) select a portion of the incoming symbol sequence;
c) determine a first error between the selected portion of the incoming symbol sequence and a first predetermined symbol sequence using a difference metric;
d) determine using the difference metric a set of second errors between the selected portion of the incoming symbol sequence and a respective set of second predetermined symbol sequences, each formed by prepending different length portions of a predetermined preamble symbol sequence to a beginning of the first predetermined symbol sequence; and
e) determine a minimum error from the first error and the set of second errors;

wherein, if the first error is not the minimum error, the radio receiver is arranged to select a different portion of the incoming symbol sequence and repeating steps c) to e); and if the first error is the minimum error, the radio receiver is arranged to decode a following portion of the incoming symbol sequence to produce a data payload.

Thus, it will be recognised by those skilled in the art that the invention enables a data payload to be more reliably produced, because the likelihood of the receiver erroneously attempting to decode a portion of the incoming symbol sequence other than that corresponding to the data payload is reduced—i.e. incorrect (e.g. early) frame synchronisation is made less likely. By comparing the selected portion of the incoming symbol sequence not only to the first predetermined symbol sequence (e.g. a coded access address) but also to the set of second predetermined symbol sequences (e.g. corresponding to the coded access address prepended with some of the preamble), and only proceeding to decode the following portion when the first error is the minimum error, the receiver can be more confident that the selected portion of the symbol sequence actually corresponds to the first predetermined symbol sequence (i.e. increasing the likelihood of correct frame synchronisation) rather the erroneously treating the end of the preamble as part of the predetermined symbol sequence. The Applicant has recognised that this can be a common source of synchronisations errors.

The aforementioned approach may improve communication reliability and may also reduce energy use, because the receiver is less likely to waste time attempting to decode a portion of the incoming symbol sequence that doesn't correspond to the data payload. For instance, if the selected portion of the incoming symbol sequence is actually one symbol too early (i.e. so it comprises a final symbol of the preamble followed by all but the final symbol of the first predetermined symbol sequence, with any transmission errors), the corresponding second predetermined symbol sequence is likely to be more similar to the selected portion than the first predetermined symbol sequence, so that corresponding second error will be less than the first error (i.e. the first error will not be the minimum). In this case, the selected portion may be discarded without making any attempt to decode the following portion, and a new portion selected (e.g. a portion starting one symbol later, which in this case is the correct portion). Early frame synchronisation (by one symbol) is thus avoided.

In some embodiments, the incoming symbol sequence contains a coded bit sequence (e.g. wherein one bit in the bit sequence is represented by several symbols in the symbol sequence). The incoming symbol sequence may comprise a bit sequence encoded with an error correcting coding scheme, e.g. a convolutional coding scheme such as an FEC coding scheme, and/or a pattern mapping scheme (e.g. in which an '0' symbol is mapped to '0011' and a '1' symbol is mapped to '1100'). Different portions of the bit sequence may be encoded with different coding schemes (or may not be encoded at all). For instance, the incoming symbol sequence may comprise a packet according to the Bluetooth LE coded standard, comprising a header section encoded with an S=8 coding scheme, and a payload section encoded with an S=8 or an S=2 coding scheme. The receiver may remove a pattern map from the incoming symbol sequence before selecting a portion to compare to the predetermined symbol sequences.

In some embodiments, the first predetermined symbol sequence corresponds to an address, e.g. an access address which identifies the digital radio receiver and/or a particular radio communication link (e.g. a particular series of bits that identify a particular Bluetooth connection). The first predetermined symbol sequence may comprise a coded version of the address, e.g. with multiple symbols used to represent each bit of the address. The first predetermined symbol sequence may comprise an address encoded with an error correcting coding scheme, e.g. a convolutional coding scheme such as an FEC coding scheme, and/or a pattern mapping scheme (e.g. where one bit is represented a fixed pattern of symbols). For example, the first predetermined symbol sequence may comprise a 16-bit or 32-bit address encoded according to an S=2 coding scheme (i.e. with two symbols-per-bit, producing a 32-symbol or 64-symbol sequence). In some embodiments the first predetermined symbol sequence may comprise a 16-bit or 32-bit address encoded according to an S=8 coding scheme (i.e. with 8 symbols-per-bit, producing a 256-symbol sequence), e.g. a Bluetooth LE coded access address, which is encoded with a two symbol-per-bit FEC coding scheme, and a P=4 pattern mapper.

In some sets of embodiments, if the incoming symbol sequence contains a packet intended for the digital radio receiver, it comprises a preamble section followed immediately by a coded address section corresponding to (and possibly identical to, if transmission errors are low) the first predetermined symbol sequence. The Applicant has recognised that in such situations, for some coded addresses, a portion of the incoming symbol sequence starting one or a few symbols earlier than the address section can resemble closely the coded address section (e.g. within a Hamming distance similar to that expected to result from transmission errors). For instance, for a 16-bit address encoded according to an FEC S=2 coding scheme, there may be 228 potentially problematic addresses. Simply applying a pre-set frame synchronisation threshold to the error between a selected portion of the incoming symbol sequence and the first predetermined symbol sequence can therefore lead to false positives which result in early frame synchronisation errors. However, by also considering the error between the selected portion and a symbol sequence made up of an end portion of the preamble concatenated with a beginning portion of the first predetermined symbol sequence as in embodiments of the present invention, the receiver may be less likely to produce a false positive and early frame synchronisation may be avoided.

The difference metric may comprise a Hamming distance (i.e. the number of positions at which two symbol sequences differ). A Hamming distance is an easily calculable difference metric that may provide a sufficiently accurate and reliable indication of the similarity or dissimilarity between two symbol sequences. The digital radio receiver may comprise one or more Hamming distance calculators arranged to calculate the first and/or second errors. In some embodiments other difference metrics may be used, for example a Euclidean distance.

In some embodiments the method further comprises checking that the selected portion of the incoming symbol sequence corresponds to the first predetermined symbol sequence (e.g. a coded address check). This additional test may help to prevent the digital radio receiver from attempting to decode a portion of the incoming bit sequence which does not actually carry a data payload intended for the receiver (e.g. which simply happens by chance to cause the first error to be the minimum error). Checking that the selected portion of the incoming symbol sequence corresponds to the first predetermined symbol sequence may comprise, if the first error is the minimum error, comparing the first error to a threshold and only decoding the following portion if the first error is below the threshold.

However, as mentioned above, using a pre-set threshold for a coded address check may produce false positives if the threshold is set too high, and an unnecessarily reduced radio connection range if it is set too low. Thus in some embodiments, additionally or alternatively, the method comprises:

determining a most-likely coded address corresponding to the selected portion of the incoming symbol sequence;

determining a fit error between the most likely coded address and the selected portion of the incoming symbol sequence; and if the first error is the minimum error, determining an offset between the first error and the fit error, and only decoding the following portion if the offset is equal to or less than an offset threshold.

In such embodiments, the most-likely coded address is the coded address that is most likely to correspond to the selected portion of the incoming symbol sequence (i.e. the coded address that the selected portion most closely resembles). If the fit error between the most-likely coded address and the selected portion is equal or similar to the first error between the first predetermined symbol sequence and the selected portion, it is likely that the selected portion does indeed correspond to the first predetermined symbol sequence (e.g. the coded address which identifies the receiver).

This approach may be less likely to generate false positives, because even if the first error happens to be the minimum error and relatively low (e.g. below a pre-set threshold), the following portion is only decoded if the offset indicates that the selected portion of the incoming symbol sequence closely matches the first predetermined symbol sequence. In other words, if the error between the incoming symbol sequence and the coded address it best resembles is equal to or close to the error between the incoming symbol sequence and the first predetermined symbol sequence (e.g. a predetermined coded address), it is presumed that the coded address it best resembles is in fact the first predetermined symbol sequence, without actually having to compare the two (which requires additional logic and processing effort). Additionally, some techniques for determining a most-likely coded address have a non-zero probability of producing a most-likely coded address which is does not match the first predetermined symbol sequence even when the underlying coded address does (e.g. where the technique encounters a decision where both branches have equal probability). However, the applicant has recognised that in such cases the most-likely coded address found is still likely to have the same or a similar fit error to the incoming symbol sequence as the first error between the incoming symbol sequence and the first predetermined symbol sequence. Thus, avoiding a direct comparison may also prevent radio signals that are intended for the receiver being inadvertently discarded.

The fit error may be determined using a difference metric (e.g. a Hamming distance). This may be the same difference metric used to determine the first and second errors.

In some embodiments, the most-likely coded address comprises a maximum likelihood sequence detection (MLSD) solution. The most-likely coded address may comprise one of a predetermined plurality of possible addresses (e.g. a plurality of addresses specified as part of a communications standard such as Bluetooth LE, and/or a plurality of addresses that comprise a characteristic bit structure). In some embodiments, determining the most-likely coded address solution comprises using a Viterbi decoding method. In some embodiments, the offset threshold is equal to zero.

The digital radio receiver may be arranged to determine the first error and the set of second errors in parallel (e.g. simultaneously, for instance using a plurality of Hamming distance calculators each arranged to determine a respective error of the first and second errors).

The set of second errors may comprise a single second error, i.e. between the selected portion of the incoming symbol sequence and a second predetermined symbol sequence formed by prepending a portion of the predetermined preamble symbol sequence to a beginning of the first predetermined symbol sequence. For instance, in some such embodiments the second predetermined symbol sequence comprises the first predetermined symbol sequence prepended by a final symbol of the predetermined preamble symbol sequence. In such embodiments, the second predetermined symbol sequence may comprise a truncated version of the first predetermined symbol sequence (e.g. with the final symbol omitted), to ensure it has the same length as the non-truncated first predetermined symbol sequence.

In some embodiments, the set of second errors comprises a plurality of errors, i.e. between the selected portion of the incoming symbol sequence and a respective plurality of second predetermined symbol sequences, each formed by prepending a different portion of a predetermined preamble symbol sequence to beginning portions of the first predetermined symbol sequence (e.g. with final portions truncated).

In some such embodiments, the plurality of second predetermined symbol sequences may comprise successively longer final portions of the predetermined preamble symbol sequence (e.g. the final one, two, three, four, etc. symbols) concatenated to beginning portions of the first predetermined symbol sequence (i.e. prepended thereto). Thus, in such embodiments, the receiver checks to see if the selected portion of the incoming symbol sequence corresponds to the first predetermined symbol sequence, or if the selected portion is one, two, three, four etc. symbols too early. As explained above, early frame synchronisation to a portion of the incoming symbol sequence containing a few final symbols of the preamble may be a common cause of decoding errors.

In some sets of embodiments the plurality of second predetermined symbol sequences comprises four or more second predetermined symbol sequences and in embodiments the plurality of second predetermined symbol sequences may comprise up to sixteen or more second predetermined symbol sequences.

The incoming radio signal may comprise a carrier signal modulated by a digital signal corresponding to the incoming symbol sequence. The incoming radio signal may comprise any kind of suitable modulation but in some embodiments the radio signal is modulated according to a frequency modulation scheme, such Gaussian Frequency Shift Keying (GFSK). The incoming radio signal may comprise a Bluetooth™ radio signal.

The receiver typically demodulates the incoming radio signal to produce the incoming symbol sequence. The receiver may synchronise to a frequency of the incoming radio signal e.g. by detecting the timing and/or frequency of a preamble portion comprised by the incoming symbol sequence.

In some embodiments, the receiver employs hard-decision demodulation to produce the incoming symbol sequence, e.g. wherein the incoming symbol sequence comprises a series of binary values (i.e. a series of 0s and 1s). For example, the receiver may compare a property of the incoming radio signal (such as frequency or amplitude) to a fixed threshold to decide whether it comprises a 0 symbol or a 1 symbol at that moment. For instance, if the radio signal is modulated with a Frequency Shift Keying (FSK) scheme with a binary '0' represented by a frequency of 100 MHz and a binary '1' represented by a frequency of 101 MHz, all time periods in which the frequency of the radio signal is above 100.5 MHz may be categorised as a '1' symbol, and time periods in which the frequency of the radio signal is below 100.5 MHz may be categorised as an '0' symbol. In embodiments where the receiver uses hard-decision demodulation, the difference metric may comprise a Hamming distance.

In some alternative embodiments, the receiver employs soft-decision demodulation to produce the incoming symbol sequence, e.g. wherein the incoming symbol sequence comprises a series of symbols with more than two possible binary values, indicating a confidence or likelihood that the symbol represents a certain binary state. In such embodiments the incoming symbol sequence may comprise a series of symbols having a continuous value between 0 and 1, or having one of a plurality of discrete values between 0 and 1. The receiver may determine the value of a symbol by measuring a property of the incoming radio signal such as frequency or amplitude in a time period corresponding to that symbol. For instance, if the radio signal is modulated with a Frequency Shift Keying (FSK) scheme with a binary '0' represented by a frequency of 100 MHz and a binary '1' represented by a frequency of 101 MHz, symbols may be categorised using a linear mapping of the interval between 100 MHz and 101 MHz to the interval between 0 and 1 (e.g. in which a time period with a frequency of 100.6 MHz is categorised as a '0.6' symbol, which may indicate a '1' binary state with a confidence of 60%). Using soft-decision demodulation may produce more accurate results because information is not lost at the demodulation stage, although it may be more computationally intensive. In embodiments where the receiver uses soft-decision demodulation, the difference metric may comprise a Euclidean distance.

The receiver may store the incoming symbol sequence. For instance, the receiver may comprise a buffer arranged to store the incoming symbol sequence. The receiver may comprise a shift register in which the selected portion of the incoming symbol sequence is held whilst the first and second errors are calculated.

Using an offset between the first error and a fit error to check a coded address as described above is independently inventive. Thus, from a further aspect of the present invention there is provided a method of checking a coded address comprising:

a) receiving an incoming radio signal comprising an incoming symbol sequence;
b) selecting a portion of the incoming symbol sequence;
c) determining a first error between the selected portion of the incoming symbol sequence and a first predetermined symbol sequence;
d) determining a most-likely coded address corresponding to the selected portion of the incoming symbol sequence;
e) determining a fit error between the selected portion of the incoming symbol sequence and the most-likely coded address;
e) determining an offset between the first error and the fit error and comparing said offset to an offset threshold;

if the offset is greater than the offset threshold, selecting a different portion of the incoming symbol sequence and repeating steps c) to e); and if the offset is less than or equal to the offset threshold, decoding a following portion of the incoming symbol sequence to produce a data payload.

The invention extends to a digital radio receiver arranged to:

a) receive an incoming radio signal comprising an incoming symbol sequence;
b) select a portion of the incoming symbol sequence;
c) determine a first error between the selected portion of the incoming symbol sequence and a first predetermined symbol sequence;
d) determine a most-likely coded address corresponding to the selected portion of the incoming symbol sequence;
e) determine a fit error between the selected portion of the incoming symbol sequence and the most-likely coded address;
e) determine an offset between the first error and the fit error and compare said offset to an offset threshold;

if the offset is greater than the offset threshold, select a different portion of the incoming symbol sequence and repeat steps c) to e); and if the offset is less than or equal to the offset threshold, decode a following portion of the incoming symbol sequence to produce a data payload.

In some embodiments, the most-likely coded address comprises a maximum likelihood sequence detection (M LSD) solution. In some embodiments determining the most-likely coded address solution comprises using a Viterbi decoding method. In some embodiments, the offset threshold may be equal to zero.

The difference metric may comprise a Hamming distance.

The incoming symbol sequence may comprise a data packet, e.g. according to the Bluetooth LE coded standard. The incoming symbol sequence may comprise a coded bit sequence.

Features of any aspect or embodiment described herein may, wherever appropriate, be applied to any other aspect or embodiment described herein. Where reference is made to different embodiments, it should be understood that these are not necessarily distinct but may overlap. It will be appreciated that all of the relevant preferred features of the method and apparatus according to the first and second aspects described above may also apply to the other aspects of the invention.

One or more non-limiting examples will now be described, by way of example only, and with reference to the accompanying figures in which.

Figure 1:
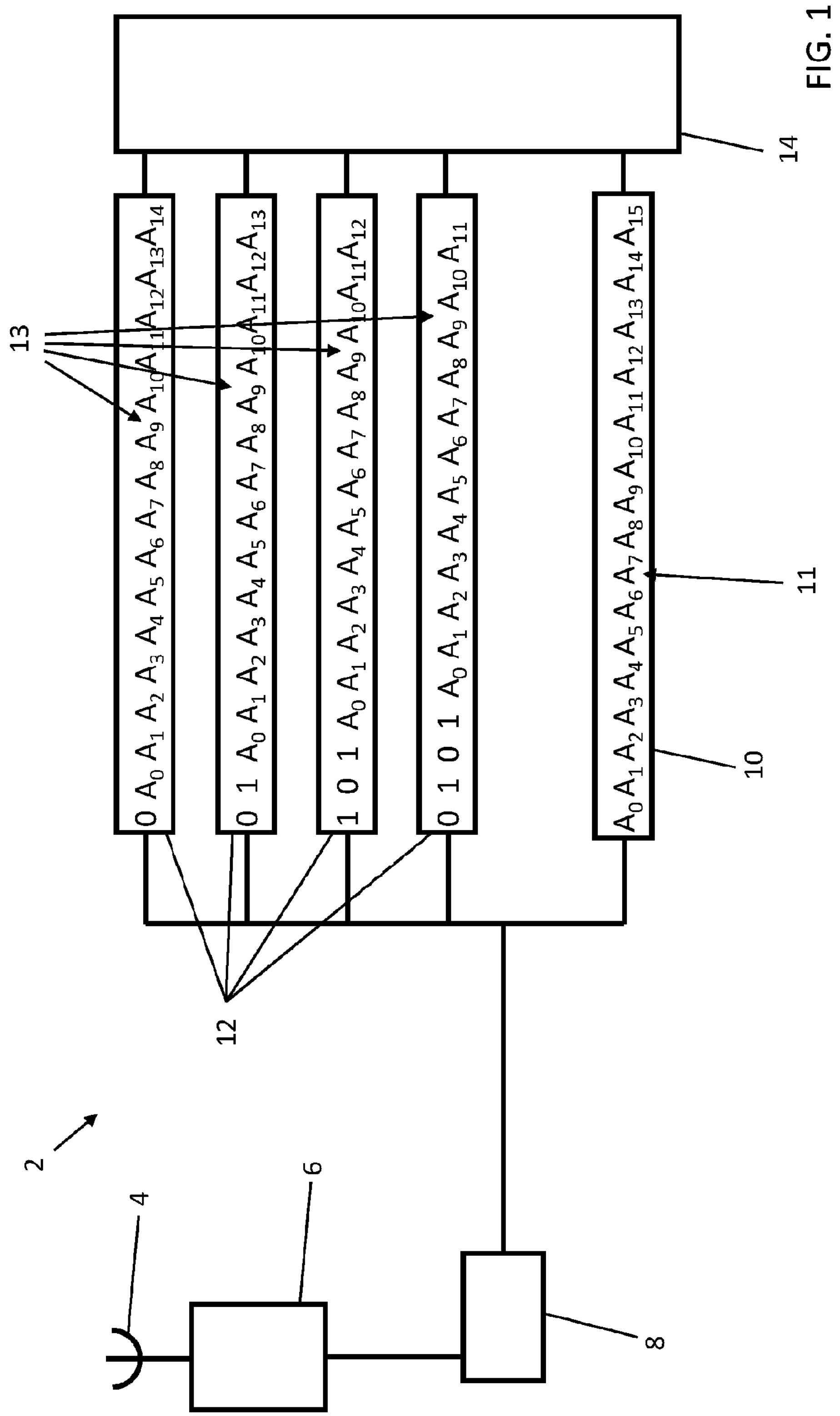
FIG. 1 is a schematic diagram of a digital radio receiver according to an embodiment of the present invention.

FIG. 1 shows a digital radio receiver 2 comprising an antenna 4, an RF module 6 (e.g. including one or more baluns, amplifiers, mixers, oscillators, filters, ADCs, demodulators or buffers), a shift register 8, a first Hamming distance calculator 10, a set of second Hamming distance calculators 12 and a comparison circuit portion 14.

Figure 3:
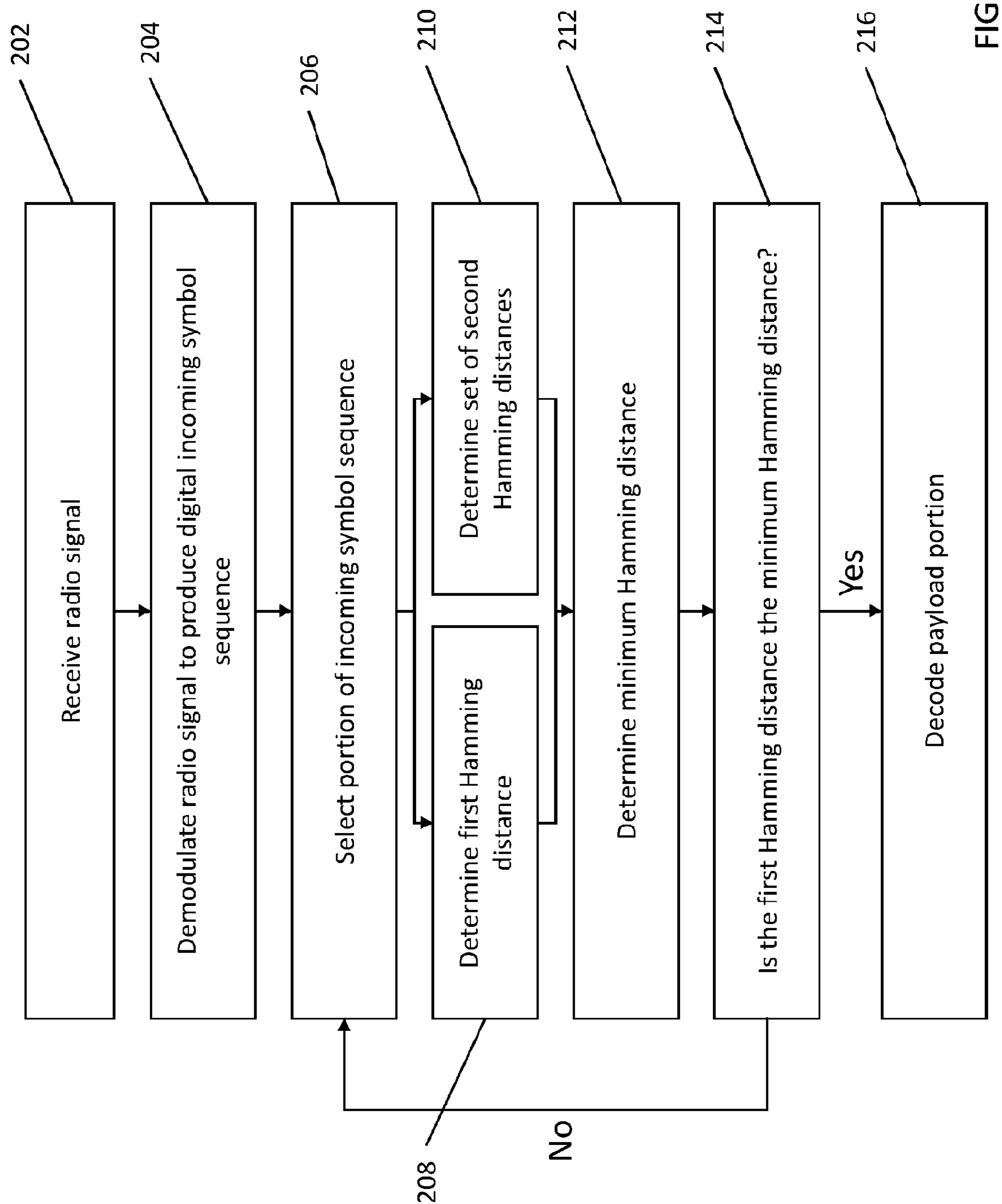
FIG. 3 is a flow diagram illustrating a method of operating the digital radio receiver of FIG. 1 in accordance with an embodiment of the invention.

A flow diagram illustrating the operation of the digital radio receiver 2 is shown in FIG. 3. In step 202, the digital radio receiver 2 receives a modulated radio signal (e.g. a GFSK modulated radio signal) via the antenna 4 which comprises a digital incoming symbol sequence. In step 204, the RF module 6 filters, amplifies and demodulates the radio signal to produce the incoming symbol sequence.

Figure 2:
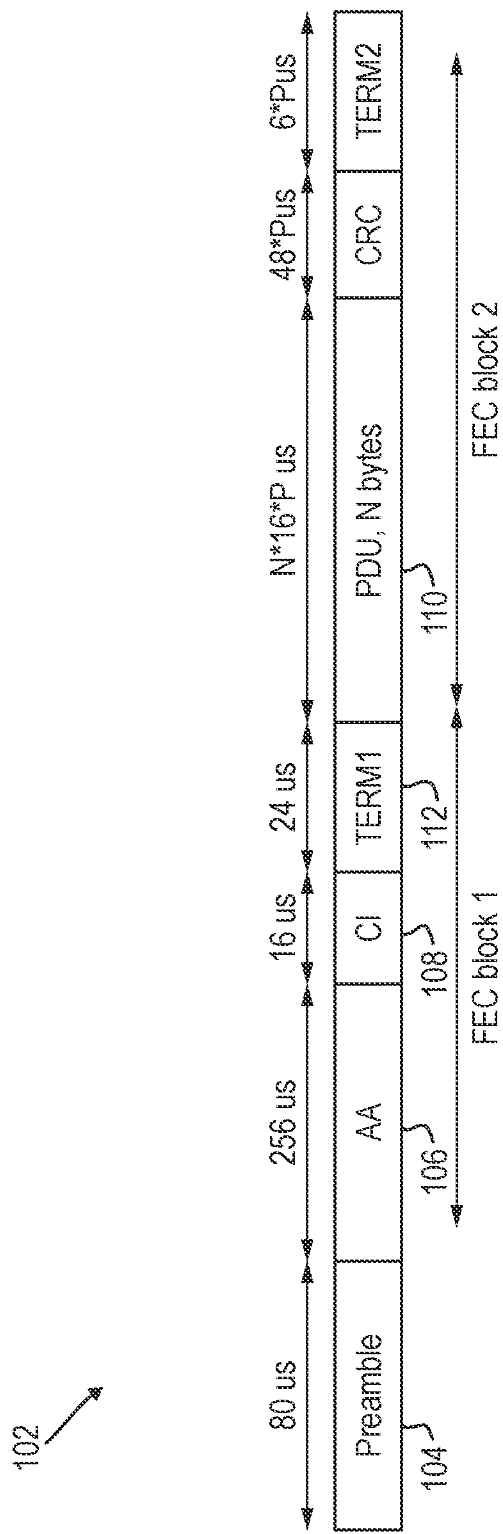
FIG. 2 shows the structure of a Bluetooth LE Coded packet.

The incoming symbol sequence contains a data packet, for instance a Bluetooth Low Energy Coded (LE Coded) packet. The structure of a LE Coded packet is shown in FIG. 2. The packet 102 comprises a preamble portion 104 followed immediately by an access address portion 106.

The preamble portion 104 comprises ten repetitions of the 8-symbol pattern '00111100' (i.e. the pattern '01' with a P=4 pattern map applied thereto). As part of step 202, the RF module 6 detects this repeating pattern and uses it to synchronise the frequency of the receiver 2 to the incoming radio signal (e.g. to correct for frequency offsets caused by the Doppler effect).

The access address portion 106 comprises a 32 bit access address encoded with an S=8 Forward Error Correction (FEC) coding scheme (including P=4 pattern mapping), producing eight symbols for every one data bit and resulting in a 256 symbol access address portion 106. The access address portion 106 is followed by a 16 symbol (i.e. 2 bit) coding indicator portion 108, which indicates the coding scheme applied to the later payload portion 110 (which contains the actual data of interest carried by the packet 102). In the case of an LE Coded packet 102, the coding scheme used for the payload portion 110 is either an S=2 or S=8 FEC coding scheme. A 24-symbol (3-bit) termination portion 112 follows the coding indicator 108, immediately preceding the payload portion 108

To ensure that the data packet 102 is intended for the receiver 2, the receiver 2 must check that that access address portion 106 corresponds to a predetermined access address associated with the receiver 2 (e.g. associated with a particular Bluetooth connection of which the receiver 2 is a part). Identifying the position of the access address portion 106 within the incoming symbol sequence also helps with frame synchronisation (i.e. identifying where in the symbol sequence the payload portion 110 begins).

In step 206, the receiver 2 selects a portion of the incoming symbol sequence and loads it into the shift register 8. In this example the receiver 2 removes the P=4 pattern map on the incoming symbol sequence before the selected portion is loaded into the shift register 8, but this is not essential. In step 208, the first Hamming distance calculator 8 calculates a first Hamming distance between the selected portion in the shift register 8 and a coded access address 11 produced by encoding the predetermined access address with the same FEC coding scheme (although without the P=4 pattern map in this example) as that of the access address portion 106. In FIG. 1 the coded address 11 is shown as being 16 symbols long ($A_0$-$A_{15}$), but this is merely illustrative—the coded address may be up to 256 symbols long (e.g. in the case of a Bluetooth LE coded packet), or even longer in other embodiments.

In step 210 (which may happen at the same time as step 208), the set of second Hamming distance calculators 12 determines a set of second Hamming distances between the selected portion of the incoming symbol sequence and a set of respective second predetermined symbol sequences 13. Each of the second predetermined symbol sequences 13 is formed by prepending a different number of final symbols of the preamble portion 104 to the beginning of the coded address 11, with the same number of final symbols of the coded address 11 truncated to keep the length of the second predetermined symbol sequences 13 the same as that of the coded address 11 (i.e. shown as 16 symbols in FIG. 1).

As mentioned above, the incoming symbol sequence decoded from the radio signal contains a data packet (e.g. an LE Coded packet). However, even when the repeated preamble portion is detected (e.g. as part of an initial synchronisation step) the receiver 2 does not know exactly where (i.e. at which symbol of the incoming symbol sequence) the address portion 106 or the payload portion 110 begins and thus how it should decode the incoming symbol sequence to reproduce the data contained within. Furthermore, due to noise and interference, the incoming symbol sequence may not match exactly the symbol sequence that forms the data packet. By determining the first Hamming distance between the selected portion of the incoming symbol sequence and the coded address 11, along with the set of second Hamming distances between the selected portion of the incoming symbol sequence and the second predetermined symbol sequences 13, the receiver 2 determines how closely the selected portion of the incoming sequence symbol matches the expected address but also how close a match would be found if the expected address has certain numbers of symbols from the preamble added to the beginning (prepended).

In step 212, the receiver 2 determines a minimum Hamming distance (i.e. the smallest error) of the first and second Hamming distances. If the first Hamming distance is the minimum error, the receiver 2 deduces that the selected portion is likely to be the address portion 106 of the data packet 102. This means that the position of the address portion 106 within the incoming symbol sequence has been found (i.e. frame synchronisation has been completed), and that the address portion 106 matches the access address associated with the receiver 2 (although additional tests may, in some examples, be applied to confirm this). The receiver than goes on to decode the payload portion 110 of the data packet accordingly in step 216.

However, if at step 214 the first error is not the minimum error (i.e. if one of the set of second Hamming distances is the minimum error), the receiver concludes that the position of the address portion 106 has not been correctly found as it is more likely to be one or more symbols too early, and returns to step 206 where a new portion of the symbol sequence (e.g. starting one symbol later) is selected. Early frame synchronisation is thus avoided.

Figure 4:
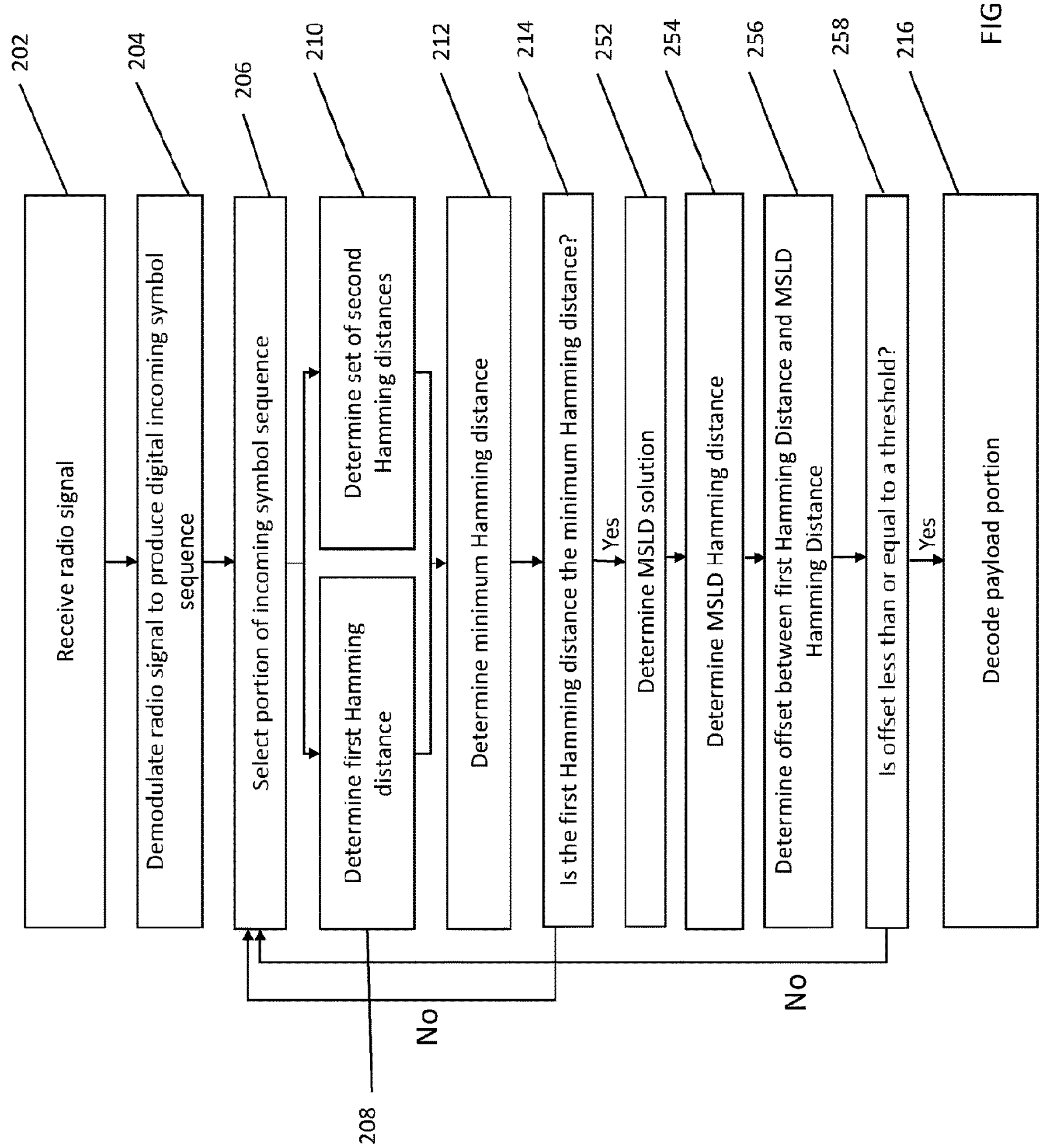
FIG. 4 is a flow diagram illustrating a method of operating the digital radio receiver of FIG. 1 in accordance with another embodiment of the invention.
Figure 5:
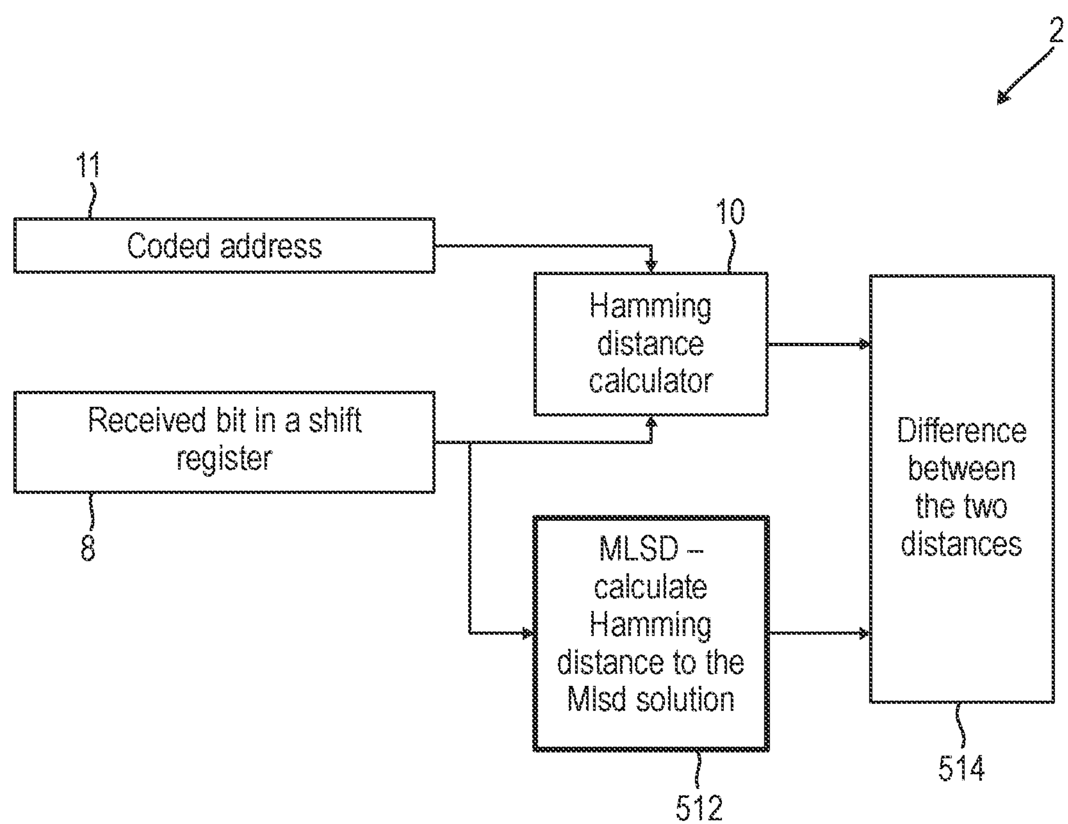
FIG. 5 is a schematic diagram of part of the digital radio receiver for performing coded address checking.

As mentioned above, in some examples an additional test may be applied to check that the address portion 106 matches the access address associated with the receiver 2 (a coded address check). For instance, the first error may be compared to a pre-set threshold and the receiver 2 may only proceed to decoding if the first error is below this threshold. However, in some examples. FIG. 4 shows another method of operating the digital radio receiver 2 in which a different coded address checking approach is used. This method comprises all the steps of the method shown in FIG. 2, which will therefore not be described again, but also comprises additional steps 252-258 before the payload is decoded. FIG. 5 illustrates part of the digital radio receiver 2 for performing the coded address checking. The part of the receiver 2 illustrated in FIG. 5 comprises the shift register 8, the first Hamming distance calculator 10, an MLSD solver 512, and a comparison circuit portion 514.

In this embodiment the MSLD solver 512, in step 252 (which follows step 214), determines a most-likely coded address corresponding to the selected portion of the incoming symbol sequence using a maximum likelihood sequence detection (M LSD) technique. The most-likely coded address (the "M LSD solution") is the coded address that is most likely to correspond to the selected portion of the incoming symbol sequence. If the data packet comprised by the incoming symbol sequence is intended for the receiver 2, the most-likely coded address is likely to may match the coded address 11 associated with the receiver 2.

In step 254, the MSLD solver 512 determines an MSLD Hamming distance between the MSLD solution and the selected portion of the incoming symbol sequence (i.e. a measure of how well the MSLD solution fits the selected portion).

In step 256, the comparison circuit portion 514 determines an offset between the MSLD Hamming distance and the first Hamming distance calculated at step 208. If the offset is low (e.g. equal to zero), it is likely that the MSLD solution matches the coded address 11, providing confirmation that the selected portion of the incoming symbol sequence is indeed the address portion 106 of the data packet and that this matches the access address associated with the receiver 2. Thus in step 258 the comparison circuit portion 514 compares the offset to a predetermined threshold (e.g. zero). If the offset is less than or equal to the threshold, the receiver 2 goes on to decode the payload portion in step 216. If not, the receiver returns to step 206, selecting a new portion of the incoming symbol sequence.

This embodiment further reduces the probability of false frame synchronisation and thus improves the performance of the receiver, because it is not necessary to actually compare the MSLD solution to the coded address 11 (which requires additional logic and processing effort).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of operating a digital radio receiver comprising:

a) receiving an incoming radio signal comprising an incoming symbol sequence;

b) selecting a portion of the incoming symbol sequence;

c) determining a first error between the selected portion of the incoming symbol sequence and a first predetermined symbol sequence using a difference metric;

d) determining, using the difference metric, a set of second errors between the selected portion of the incoming symbol sequence and a respective set of second predetermined symbol sequences, each formed by prepending different length portions of a predetermined preamble symbol sequence to a beginning of the first predetermined symbol sequence; and e) determining a minimum error from the first error and the set of second errors;

if the first error is not the minimum error, selecting a different portion of the incoming symbol sequence and repeating steps c) to e); and if the first error is the minimum error, decoding a following portion of the incoming symbol sequence to produce a data payload.

2. The method of claim 1, wherein the incoming symbol sequence contains a coded bit sequence encoded with an error correcting coding scheme.

3. The method of claim 1, wherein the first predetermined symbol sequence corresponds to an access address identifying the digital radio receiver and/or a particular radio communication link.

4. The method of claim 1, wherein the difference metric comprises a Hamming distance.

5. The method of claim 1, further comprising checking that the selected portion of the incoming symbol sequence corresponds to the first predetermined symbol sequence.

6. The method of claim 5, wherein checking that the selected portion of the incoming symbol sequence corresponds to the first predetermined symbol sequence comprises, if the first error is the minimum error, comparing the first error to a threshold and only decoding the following portion if the first error is below the threshold.

7. The method of claim 1, comprising:

determining a most-likely coded address corresponding to the selected portion of the incoming symbol sequence;

determining a fit error between the most likely coded address and the selected portion of the incoming symbol sequence; and if the first error is the minimum error, determining an offset between the first error and the fit error, and only decoding the following portion if the offset is equal to or less than an offset threshold.

8. The method of claim 7, wherein the fit error comprises a Hamming distance.

9. The method of claim 7, wherein the most-likely coded address comprises a maximum likelihood sequence detection (MLSD) solution.

10. The method of claim 1, comprising determining the first error and the set of second errors in parallel.

11. The method of claim 1, wherein the set of second errors comprises a plurality of errors between the selected portion of the incoming symbol sequence and a respective plurality of second predetermined symbol sequences, each formed by prepending a different portion of a predetermined preamble symbol sequence to beginning portions of the first predetermined symbol sequence.

12. The method of claim 11, wherein the plurality of second predetermined symbol sequences comprises successively longer final portions of the predetermined preamble symbol sequence concatenated to beginning portions of the first predetermined symbol sequence.

13. The method of claim 1, wherein the incoming radio signal is modulated according to a frequency modulation scheme.

14. The method of claim 13, comprising employing soft-decision demodulation to produce the incoming symbol sequence.

15. A digital radio receiver arranged to:

a) receive an incoming radio signal comprising an incoming symbol sequence;

b) select a portion of the incoming symbol sequence;

c) determine a first error between the selected portion of the incoming symbol sequence and a first predetermined symbol sequence using a difference metric;

d) determine using the difference metric a set of second errors between the selected portion of the incoming symbol sequence and a respective set of second predetermined symbol sequences, each formed by prepending different length portions of a predetermined preamble symbol sequence to a beginning of the first predetermined symbol sequence; and e) determine a minimum error from the first error and the set of second errors;

wherein, if the first error is not the minimum error, the radio receiver is arranged to select a different portion of the incoming symbol sequence and repeating steps c) to e); and if the first error is the minimum error, the radio receiver is arranged to decode a following portion of the incoming symbol sequence to produce a data payload.

16. The digital radio receiver of claim 15, comprising one or more Hamming distance calculators arranged to calculate the first and/or second errors.

17. The digital radio receiver of claim 15, comprising a shift register in which the selected portion of the incoming symbol sequence is held whilst the first and second errors are calculated.

18. A digital radio receiver arranged to:

a) receive an incoming radio signal comprising an incoming symbol sequence;

b) select a portion of the incoming symbol sequence;

c) determine a first error between the selected portion of the incoming symbol sequence and a first predetermined symbol sequence;

d) determine a most-likely coded address corresponding to the selected portion of the incoming symbol sequence;

e) determine a fit error between the selected portion of the incoming symbol sequence and the most-likely coded address;

e) determine an offset between the first error and the fit error and compare said offset to an offset threshold;

if the offset is greater than the offset threshold, select a different portion of the incoming symbol sequence and repeat steps c) to e); and if the offset is less than or equal to the offset threshold, decode a following portion of the incoming symbol sequence to produce a data payload.

* * * * *